(12) United States Patent
Saldivar-Valdes et al.

(10) Patent No.: US 11,257,978 B2
(45) Date of Patent: Feb. 22, 2022

(54) FRONT METAL CONTACT STACK

(71) Applicant: UTICA LEASECO, LLC, Rochester Hills, MI (US)

(72) Inventors: Abraham Saldivar-Valdes, Redwood City, CA (US); Octavi Santiago Escala Semonin, San Francisco, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 0 days.

(21) Appl. No.: 16/370,473

(22) Filed: Mar. 29, 2019

(65) Prior Publication Data

US 2020/0313007 A1 Oct. 1, 2020

(51) Int. Cl.
| | |
|---|---|
| *H01L 31/18* | (2006.01) |
| *H01L 31/06* | (2012.01) |
| *H01L 31/02* | (2006.01) |
| *H01L 31/0224* | (2006.01) |
| *H01L 31/0693* | (2012.01) |
| *H01L 31/20* | (2006.01) |
| *H01L 31/0735* | (2012.01) |

(52) U.S. Cl.
CPC .... *H01L 31/1864* (2013.01); *H01L 31/02021* (2013.01); *H01L 31/022425* (2013.01); *H01L 31/06* (2013.01); *H01L 31/0693* (2013.01); *H01L 31/0735* (2013.01); *H01L 31/184* (2013.01); *H01L 31/208* (2013.01); *Y02E 10/544* (2013.01)

(58) Field of Classification Search
CPC . H01L 31/02021; H01L 31/06; H01L 31/184; H01L 31/022425; H01L 31/0693; H01L 31/0682; H01L 31/0735; H01L 31/1864; H01L 31/208; Y02E 10/544; Y02E 10/547
See application file for complete search history.

(56) References Cited

U.S. PATENT DOCUMENTS

| | | | | |
|---|---|---|---|---|
| 4,366,338 | A  * | 12/1982 | Turner | H01L 31/0368 136/258 |
| 2008/0110498 | A1 * | 5/2008 | Zafar | H01L 31/022425 136/260 |
| 2008/0128020 | A1 * | 6/2008 | Zafar | H01L 31/0296 136/252 |
| 2009/0014056 | A1 * | 1/2009 | Hockaday | H01L 31/0543 136/247 |
| 2013/0140065 | A1 * | 6/2013 | Koo | G06F 3/041 174/256 |
| 2017/0110600 | A1 * | 4/2017 | Chang | H01L 31/1804 |
| 2017/0141256 | A1 * | 5/2017 | Kayes | H01L 31/184 |

OTHER PUBLICATIONS

International Search Report and Written Opinion corresponding to International Application No. PCT/US2020/023501, dated May 1, 2020.

\* cited by examiner

*Primary Examiner* — Lindsey A Bernier
(74) *Attorney, Agent, or Firm* — Arent Fox LLP

(57) ABSTRACT

A photovoltaic device and a method of forming a contact stack of the photovoltaic device are disclosed. The photovoltaic device may include a first layer deposited on a semiconductor layer including a compound semiconductor material. The photovoltaic device may also include a dopant layer comprising tin (Sn) deposited on the first layer. The photovoltaic device may further include a conductive layer deposited or provided over the dopant layer to form a contact stack with the first layer and the dopant layer.

12 Claims, 5 Drawing Sheets

FRONT METAL CONTACT STACK

BACKGROUND

Technical Field

The present disclosure relates generally to photovoltaic devices, and more particularly, to front metal contact stacks used in photovoltaic devices.

Introduction

A solar cell or photovoltaic device is an electrical device that receives light from a light source such as the Sun, for example, and converts the energy of the light directly into electricity by photovoltaic effect. Energy generated from a photovoltaic device offers renewable, environmentally friendly and readily available alternatives to fossil fuels. Typically, a photovoltaic device utilizes semiconductor materials, which are used to form one or more p-n junctions for energy conversion, where the p-n junction(s) separate the charge carriers produced from the energy of the light received by the photovoltaic device. Metal contacts are laid on the surface of the semiconductor materials to conduct the produced voltage and current to external circuitry for power storage or transportation, e.g., through contact with a metal wire laid on top of the extraction electrode. The metal contacts on the top surface (e.g., the surface facing the source of the light) may be referred to as the "front metal contacts." In contrast, metal contacts on a back surface of the photovoltaic device may be referred to as "back metal contacts." In a typical configuration, the front metal contacts of a photovoltaic device may include a number of discrete electrodes interspersed on the front surface of the photovoltaic device and an extraction electrode connected to all the discrete electrodes for collecting the current therefrom. An array of photovoltaic devices can be interconnected and assembled into a solar module or a solar panel to aggregate the current generated by the individual photovoltaic devices.

When manufacturing a photovoltaic device, metal contacts having low resistivity are desired to improve flow of current. Typical manufacturing methods may require the metal contacts to be annealed at a high annealing temperature (e.g., greater than 200° C.). However, for some photovoltaic devices, typical manufacturing methods may be undesired because the high annealing temperatures may damage other portions of the photovoltaic device.

Accordingly, there exists a need for further improvements in the construction and processing of metal contacts for photovoltaic devices.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, a method for forming a contact stack of a photovoltaic device is disclosed. The method may include depositing a first layer on a semiconductor layer including a compound semiconductor material. The method may also include depositing a dopant layer comprising tin (Sn) on the first layer. The method may further include depositing a conductive layer over the dopant layer to form the contact stack with the first layer and the dopant layer.

In another aspect, a photovoltaic device is disclosed. The photovoltaic device may include a first layer deposited on a semiconductor layer including a compound semiconductor material. The photovoltaic device may also include a dopant layer comprising tin (Sn) deposited on the first layer. The photovoltaic device may further include a conductive layer deposited over the dopant layer to form a contact stack with the first layer and the dopant layer.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
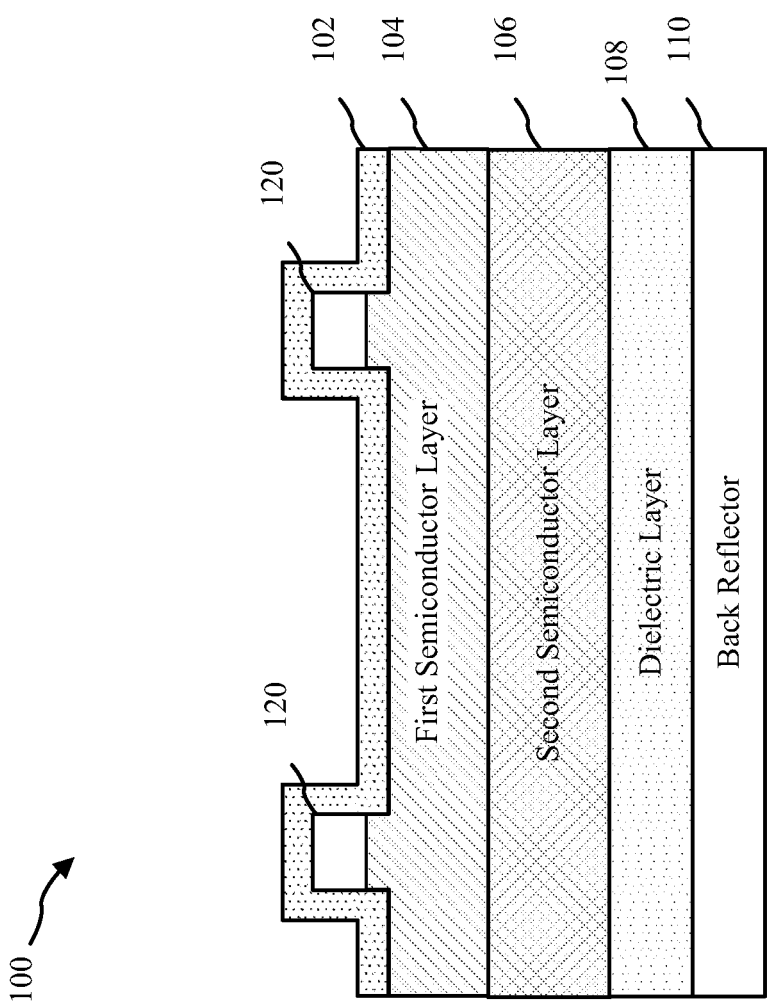
FIG. 1 illustrates an example of photovoltaic devices, according to aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

This disclosure describes devices, including photovoltaic devices, having a contact stack with low-resistivity and low-temperature annealing. The contact stack may be include a first layer that is deposited on a semiconductor layer having a compound semiconductor material comprising a group III-V semiconductor material (although other types of compound semiconductor materials may also be used). A dopant layer comprising tin (Sn) or a tin alloy may be deposited on the first layer, and a conductive layer may be deposited on the dopant layer.

Simple metal contacts to semiconductor layers having or being made at least partially of a compound semiconductor material, such as group III-V semiconductor material, are often highly resistive, especially when processed at low temperatures. To achieve a low or lower contact resistance to the compound semiconductor material special layered metal contact structures are deposited. The metal contact structures often contain one or more layers having an element meant to act as a dopant in the compound semiconductor material, which diffuses into the semiconductor layer during a thermal annealing process. The annealing process is typically carried out at high temperatures greater than 200° C. However, in some situations, these high temperatures may cause undesirable results (e.g., breakdown or separation of other materials of the photovoltaic device).

In order to achieve low contact resistivity (e.g., less than 1 mΩ·cm$^2$) using an annealing temperature under 200° C. (e.g., 175° C.), some manufactures thermally evaporate palladium (Pd), germanium (Ge), and gold (Au) to form the metal contact stack of a photovoltaic device. However, use of these materials may be costly to scale-up for large-volume manufacturing processes.

According to the present disclosure, a metal contact stack (e.g., a stack used for front metal contacts) may be composed of a first layer and a second layer comprising tin (Sn) sequentially deposited on a semiconductor layer comprising a compound semiconductor material, where the first layer contacts the semiconductor layer. One or more of the layers in the metal contact stack may be deposited electrochemically. Further, the metal contact stack may be annealed at a temperature less than 200° C. (e.g., 175° C.) to achieve low contact resistivity without damaging other parts of the photovoltaic device. The second layer may act as a dopant layer (e.g., n-type dopant), replacing commonly used germanium (Ge), which is a metal that is difficult to deposit electrochemically.

In some examples, the second layer may be a combined dopant/conductive layer formed of a tin or tin alloy material. In another example, the second layer may include a dopant layer deposited on the first layer and a conductive layer formed over the dopant layer. The dopant layer may be formed of tin or a tin alloy material, and the conductive layer may be formed of a conductive material such as copper (Cu).

The metal contact stack may also include a barrier layer deposited between the dopant layer and the conductive layer. In an example, the barrier layer may include nickel (Ni). The barrier layer may act as a barrier between the dopant layer and the conductive layer, and may prevent formation of whiskers (e.g., Sn whiskers), Kirkendall voids, and/or brittle intermetallic compounds (Cu—Sn intermetallic compounds). Kirkendall voids are voids formed as a result of the Kirkendall effect where there is a motion of the interface between two metals that occurs as a consequence of the difference in diffusion rates of the metal atoms.

FIGS. 1-5 illustrate examples of photovoltaic devices according to aspects of the present disclosure and methods of manufacturing the photovoltaic devices. It is to be understood that layers in the figures may not be drawn to scale and are instead drawn for illustrative purposes.

Referring to FIG. 1, an example of a solar cell or photovoltaic device 100 according to aspects of the present disclosure is illustrated. As shown by FIG. 1, the photovoltaic device 100 may include one or more contacts 120 located between an anti-reflective coating (ARC) layer 102 and a first semiconductor layer 104. The one or more contacts 120 may conduct voltage and current, produced through a photovoltaic process, to external circuitry (not shown). In an aspect, the one or more contacts 120 may include a metallic stack (e.g., metal contact stack) containing multiple layers of varying compositions of materials, as discussed herein.

The photovoltaic device 100 may also include an ARC layer 102. In an example, the ARC layer 102 may be disposed on the front surface of a first semiconductor layer 104. In some examples, the ARC layer 102 may be deposited in removed or etched portions of the first semiconductor layer, as shown by FIG. 1. The ARC layer 102 may contain a material that allows light to pass through a front surface of the ARC layer 102 and prevent light reflection from the front surface of the ARC layer 102. In some examples, the ARC layer 102 may contain magnesium fluoride ($MgF_2$), zinc sulfide (ZnS), titanium oxide (TiO), titanium dioxide (TiO2), niobium oxide (NbO, NbO2, or Nb2O5), silicon nitride (Si3N4), silicon oxynitride (SiOxNy), silicon oxide (SiO), silicon dioxide (SiO2), derivatives thereof, or combination thereof. In some examples, the ARC layer 202 may be one or more layers of material.

The photovoltaic device 100 may include the first semiconductor layer 104. In some examples the first semiconductor layer 104 may include compound semiconductor materials (e.g., non-silicon based materials) such as group III-V semiconductor materials, although other types of compound semiconductor materials may also be used (e.g., group II-IV semiconductor materials). The group III-V semiconductor material may include one or more group III semiconductor materials and one or more group V semiconductor materials (e.g., one group III semiconductor material and one group V semiconductor material, multiple group III semiconductor materials and one group V semiconductor material, one group III semiconductor material and multiple group V semiconductor materials, or multiple group III semiconductor materials and multiple group V semiconductor materials).

The group III-V semiconductor materials may include epitaxially grown layers which may contain a combination of two or more of gallium (Ga), arsenic (As), aluminum (Al), indium (In), or phosphorus (P) (e.g., GaAs, AlGaAs, InGaP, AlInGaP, InGaAs, AlInGaAs, InGaAsP, or AlInP). In some examples, the compound semiconductor materials of the first semiconductor layer 104 may include n-type (or n-doped) semiconductor materials or p-type (or p-doped) semiconductor materials. In some aspects, the first semiconductor layer 204 may also include a film stack containing multiple layers of varying compositions of materials including the group III-V semiconductor materials. For example, the first semiconductor layer 104 may include a contact layer, a front window, an absorber layer, and/or, an intermediate layer.

The photovoltaic device 100 may further include a second semiconductor layer 106. In some examples, the second semiconductor layer 106 may include compound semiconductor materials such as the group III-V semiconductor materials described above. The compound semiconductor materials of the second semiconductor layer 106 may include doped semiconductor materials opposite of the doped semiconductor materials of the first semiconductor layer 104. In some aspects, the compound semiconductor materials of the second semiconductor layer 106 may include a film stack containing multiple layers of varying compositions of materials including the group III-V semiconductor materials. For example, the second semiconductor layer 106 may include an emitter layer and/or a contact layer. During manufacturing, the second semiconductor layer 106 may be epitaxially grown on a back surface of the first semiconductor layer 104.

In an aspect, the photovoltaic device 100 may optionally include a dielectric layer 108. The dielectric layer 108 may boost the reflection or scattering of light impinging on or traveling through photovoltaic device 100. In some examples, the dielectric layer 108 may include an insulating material. In an example, the dielectric layer 108 may contact the second semiconductor layer 106. The dielectric layer 108 may be deposited on the back surface of the second semiconductor layer 106 during manufacturing.

The photovoltaic device 100 may also include a back reflector 110. The back reflector 110 may include a metal to reflect traversing light. Examples of metals may include gold (Au), silver (Ag), copper (Cu), aluminum (Al), or other reflective metals, derivatives thereof, and/or combinations thereof. The back reflector 110 may contact a surface of the dielectric layer 108. In some examples, the back reflector 110 may be deposited on the back surface of the dielectric layer 108 during manufacturing. The dielectric layer 108 and/or the back reflector 110 may be textured in order to improve the overall efficiency of the photovoltaic device 100.

As shown, the contacts 120 are positioned on a front side of the photovoltaic device 100 (e.g., the side facing the source of light) and, consequently, the contacts 120 may be referred to as front metal contacts.

Figure 2:
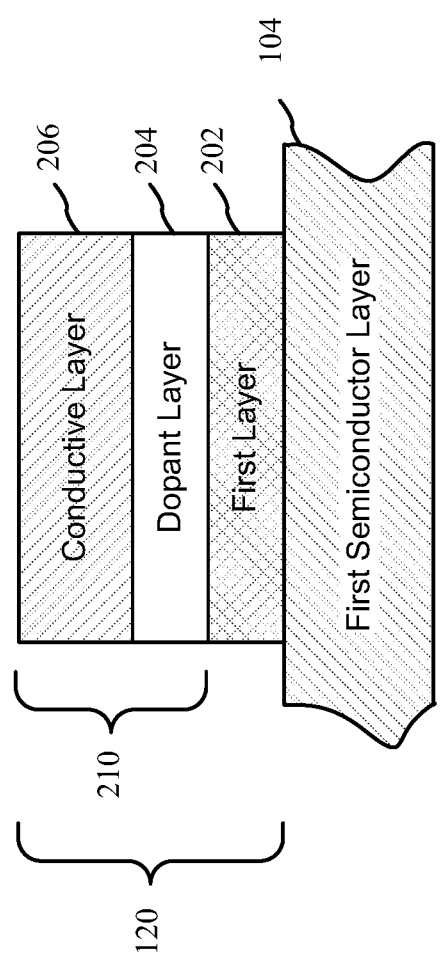
FIG. 2 illustrates an example of a contact stack, according to aspects of the present disclosure.

Referring to FIG. 2, an example of a contact 120 (e.g., metallic stack or metal contact stack) according to aspects of the present disclosure is illustrated. The contact 120 may include a first layer 202 disposed on a front surface of the first semiconductor layer 104. The first layer 202 may be formed of a material to encourage solid phase regrowth (SPR) of the first semiconductor layer 104. In an example, the material for the first layer 202 may be palladium (Pd), nickel (Ni), or platinum (Pt). Further, the first layer 202 may be a relatively thin layer, compared to other layers in the contact 120. For example, the first layer 202 may have a thickness between 1 nanometer (nm) and 25 nm.

The contact 120 may also include a dopant layer 204 disposed between the first layer 202 and a conductive layer 206. The dopant layer 204 may be formed of a material having a low to moderate contact resistivity (e.g., less than 10 mΩ·cm$^2$), and a low-annealing temperature (e.g., less than 200° C.). In an example, the dopant layer 204 may comprise tin (Sn), or a tin alloy to improve long-term reliability. The tin alloy may include one or more of lead (Pb), bismuth (Bi), Antimony (Sb), copper (Cu), or indium (In) to stabilize the tin. In some examples, the dopant layer 204 may be between 30 nm and 500 nm thick. That is, typically, the dopant layer 204 is thicker than the first layer 202 (e.g., 20 to 30 times thicker).

In an aspect, the contact 120 includes the conductive layer 206, which is a low resistive material layer for conducting current. In an example, the conductive layer 206 may include copper (Cu), tin (Sn), or gold (Au). However, other conductive materials, alone or in combination, may be used. In an example, the conductive layer 206 may have a thickness of 1-10 microns (μm). That is, typically, the conductive layer 206 is much thicker than the first layer 202 or the dopant layer 204.

In some examples, the dopant layer 204 and the conductive layer 206 may be the same material (e.g., tin (Sn) or tin alloy) and form a combined dopant/conductive layer 210. In this example, the combined dopant/conductive layer 210 may include a thick layer (e.g., 5-10 μm) of the same material (e.g., tin (Sn) or tin alloy) disposed on the first layer 202. The combined dopant/conductive layer 210 continue to act as a dopant (e.g., less than 250 nm of the combined layer 210 may act as a dopant) and a conductor. As the combined dopant/conductive layer 210 performs the same functions as a separate dopant and conductive layers, further examples will describe the dopant layer 204 and the conductive layer 206 separately.

Manufacturing

According to aspects of the present disclosure, the first layer 202, the dopant layer 204, and the conductive layer 206 (or optionally, the first layer 202 and the combined layer 210) may be sequentially deposited on the first semiconductor layer 104, where the first layer 202 contacts the semiconductor layer 104.

In some examples, any one of the layers of the contact 120 may be deposited by an electrochemical depositing method. For example, any one of the layers of the contact 120 may be deposited by a galvanic displacement plating process during which a material is deposited on a substrate from a solution containing ions of the material. In another example, any one of the layers of the contact 120 may be deposited by an electroless deposition process during which the substrate is immersed in a solution containing metal ions and a reducing agent, and the surface of the substrate acts as a catalyst to plate material on the surface. In yet another example, any one of the layers of the contact 120 may be deposited by an electroplating method in which a current is used to add a layer of a material on a substrate.

In another example, any one of the layers of the contact 120 may be deposited by a light-assisted plating method in which light is shined on a material to drive current to plate the material to a substrate. For example, in the case of the dopant layer 204 being tin or tin alloy and the first layer being palladium, tin tends to easily bond to palladium, even in the absence of current or a bias. Accordingly, the inclusion of light may be an additional catalyst to strengthen the bond between the dopant layer 204 (e.g., tin or tin alloy) and the first layer 202 (e.g., palladium).

Figure 3:
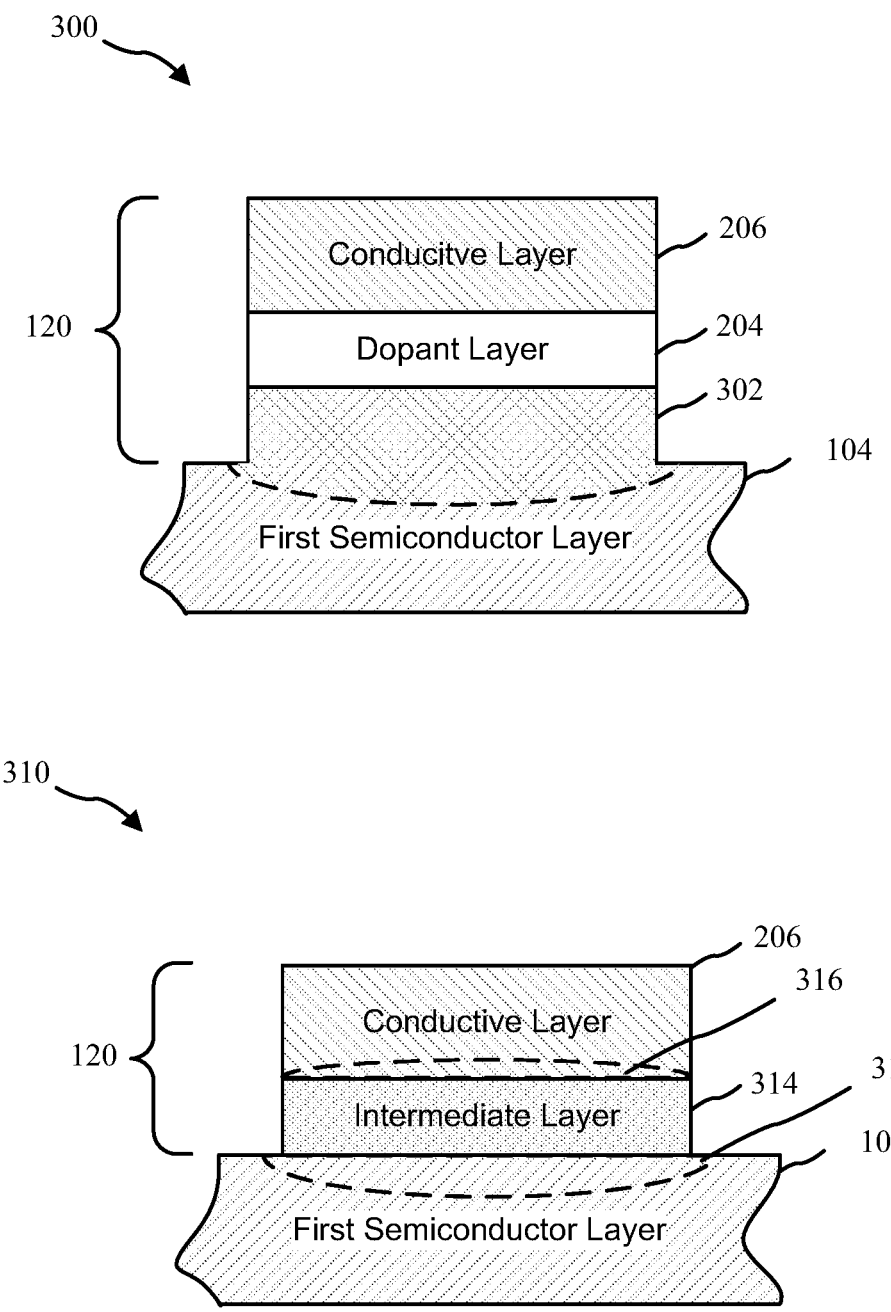
FIG. 3 illustrates an example of an annealing process of a photovoltaic device, according to aspects of the present disclosure.

Referring to FIG. 3, an annealing process according to aspects of the present disclosure is illustrated. Once the layers of the contact 120 have been sequentially deposited, an annealing process may be performed at an annealing temperature under 200° C. (e.g., 175° C.) on the photovoltaic device 100. As shown at a first state 300, during the annealing process, the first layer 202 and the dopant layer 204 may react with the first semiconductor layer 104 forming a reactive area 302 of the contact 120.

As the annealing process continues, as shown by a second state 310, the first semiconductor layer 104 contains the original material having a doped area 312 formed from the material of the dopant layer 204 (e.g., tin is incorporated into gallium arsenide). In this case, the material of the dopant layer 204 may act as a dopant of the same type as those already present in the first semiconductor layer 104, thereby increasing the total carrier concentration at the surface of the semiconductor layer 104, or may act as an anti-dopant by countering or compensating existing doping at the surface of the first semiconductor layer 104. In either case, the material of the dopant layer 204 may create an ohmic contact under the conductive layer 206. An intermediate layer 314 may be formed, which is a combination of the material of the first layer 202 and the material of the dopant layer 204. For example, the intermediate layer 314 may be formed of palladium and tin or a tin alloy. Further, extra material 316 from the dopant layer 204 may be soaked up into the conductive layer 206. Accordingly, after the annealing process, two layers, the conductive layer 206, including the extra material 316 from the dopant layer 204, and the intermediate layer 314, having a combined materials of the first layer 202 and the dopant layer 204, may remain to form the contact 120.

Figure 4:
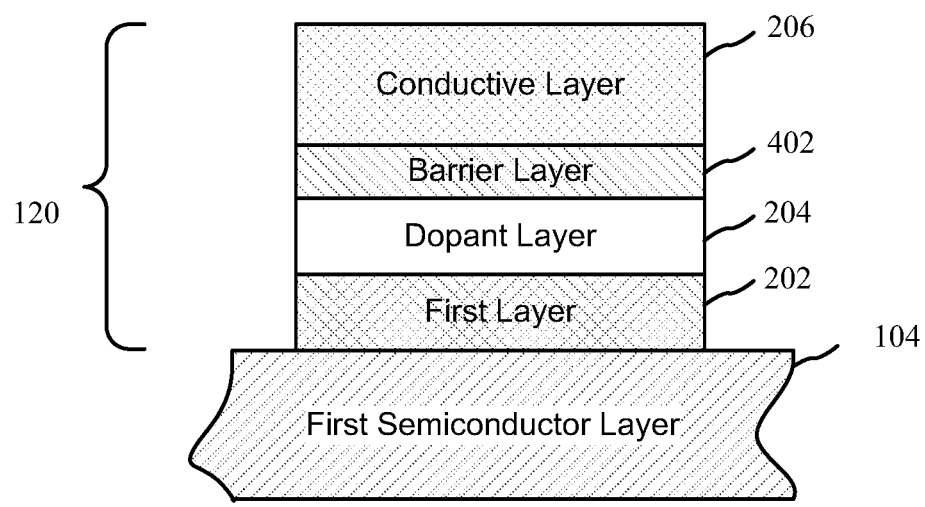
FIG. 4 illustrates another example of a contact stack, according to aspects of the present disclosure.

Referring to FIG. 4, another example of a contact 120 according to aspects of the present disclosure is illustrated. In some examples, the contact 120 may also include a barrier layer 402 deposited between the dopant layer 204 and the conductive layer 206. The barrier layer 402 may include a material having the ability to retain the materials of the dopant layer 204 from combining with materials of the conductive layer 206 and/or prevent diffusion from the semiconductor. That is, the barrier layer 402 is configured (e.g., made of a material) to prevent such combinations. In some aspects, the barrier layer 402 may also prevent intermetallics, Kirkendall voids, and/or whiskers. In an example, the barrier layer 402 may include nickel (Ni). In an example, the barrier layer 402 may have a thickness of 100-500 nm. Further, the barrier layer 402 may be deposited on the dopant layer 204 by any of the electrochemical processes previously discussed.

Figure 5:
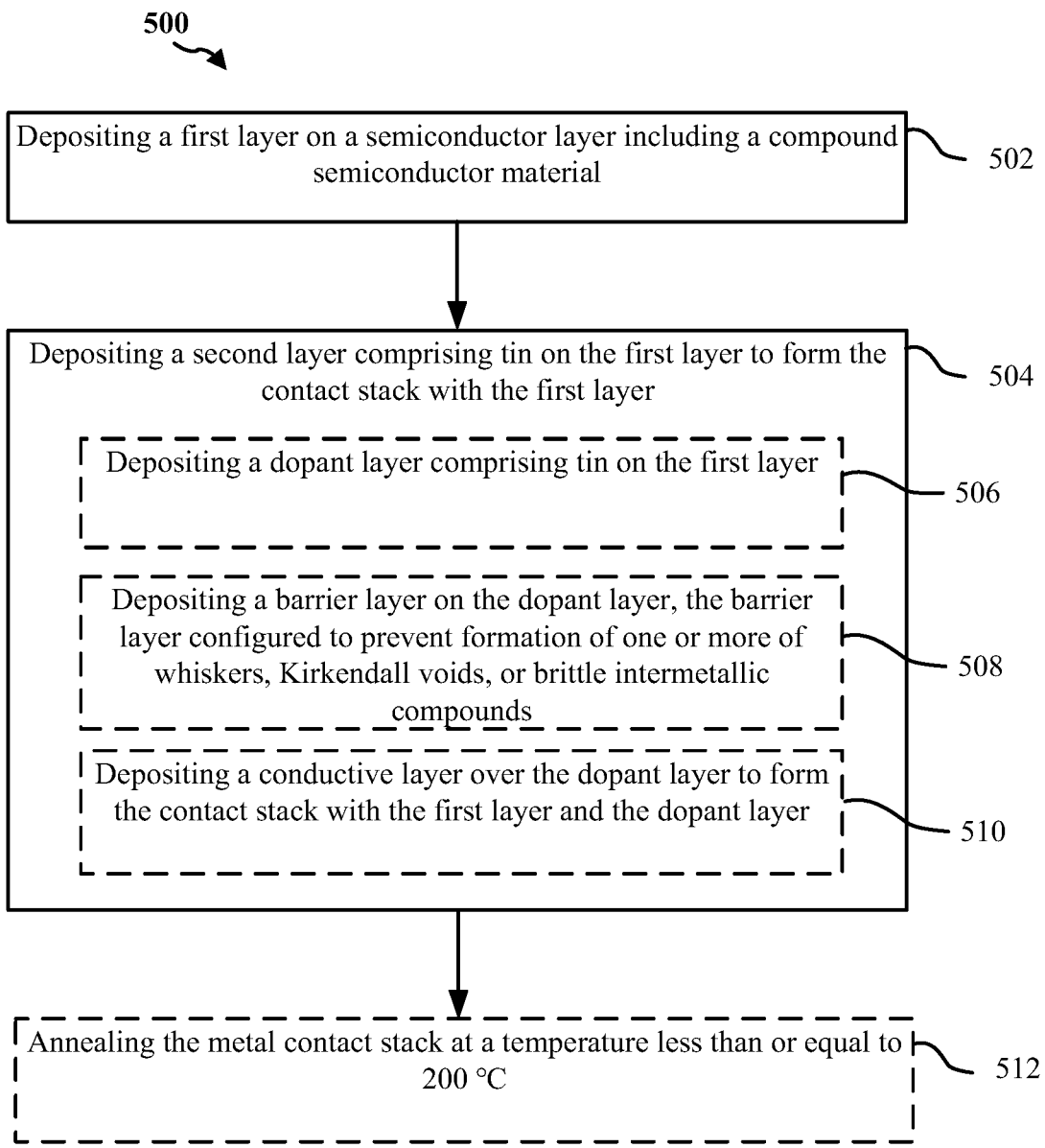
FIG. 5 illustrates an example of a method of forming a contact stack, according to aspects of the present disclosure.

Referring to FIG. 5, an example of a method 500 for forming a contact stack (e.g., metallic stack or contact metal stack) of a photovoltaic device according to aspects of the present disclosure is illustrated. At 502, the method 500 may include depositing a first layer on a semiconductor layer including a compound semiconductor material. In an example, the first layer 202 of the contact 120 may be deposited on the first semiconductor layer 104. In an aspect, the first layer may be electrochemically deposited on the first semiconductor layer 104. In an example, the first layer 202 may include palladium (Pd), nickel (Ni), or platinum (Pt). In an aspect, the first semiconductor layer 104 may include one or more epitaxially grown layers. The first semiconductor 104 may be formed by growing a group III-V semiconductor materials during a deposition process such as a vapor deposition process, including a high growth rate vapor deposition process. In an example, the first semiconductor layer 204 may be an n-type semiconductor layer.

At 504, the method 500 may include depositing a second layer comprising tin on the first layer. For example, the second layer 210 may be deposited on the first layer 202. In an example, the second layer 210 may be a combined dopant/conductive layer formed of a single material, such as tin or a tin alloy including one or more of lead (Pb), bismuth (Bi), Antimony (Sb), copper (Cu), or indium (In) to stabilize the tin and to improve long-term reliability, as described herein.

Optionally, the second layer 210 may be formed of two or more layers. For example, at 506, the method 500 may optionally include depositing a dopant layer comprising the tin on the first layer. For example, the dopant layer 204 may be deposited on the first layer 202. In an example, the dopant layer 204 may include the tin or the tin alloy. In an example, the dopant layer 204 may be deposited by an electrochemical process.

At 506, the method 500 may optionally include providing a barrier layer between the dopant layer and a conductive layer, the barrier layer formed of a material to prevent formation of one or more of whiskers, Kirkendall voids, or brittle intermetallic compounds. For example, the barrier layer 402 may be deposited on the dopant layer 204. In an example, the barrier layer may include nickel. In some examples, the barrier 402 may be deposited on the dopant layer 204 by an electrochemical process.

At 508, the method may optionally include depositing a conductive layer over the dopant layer. For example, the conductive layer 206 may be deposited over the dopant layer 204 or the barrier layer 402. In an example, the conductive layer 206 may comprise one or more of copper (Cu), tin (Sn), or gold (Au). In an example, the conductive layer 206 may be deposited by an electrochemical process.

At 510, the method 500 may optionally include annealing the contact stack at a temperature less than or equal to 200° C. For example, the contact 120 may be annealed as illustrated by FIG. 3.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method for forming a contact stack of a photovoltaic device, comprising:
   depositing a first layer including palladium on a semiconductor layer including a compound semiconductor material;
   depositing a dopant layer formed of tin on the first layer;
   depositing a conductive layer on the dopant layer to form the contact stack with the first layer; and
   annealing the contact stack until a portion of the dopant layer forms a doped area or an anti-doped area within an area of the semiconductor layer, another portion of the dopant layer is combined into the conductive layer, and the dopant layer and the first layer form a single intermediate layer between the semiconductor layer and the conductive layer.

2. The method of claim 1, wherein the compound semiconductor material comprises a group III-V semiconductor material.

3. The method of claim 2, wherein the group III-V semiconductor material comprises a combination of two or more of gallium (Ga), arsenic (As), aluminum (Al), indium (In), or phosphorus (P).

4. The method of claim 1, wherein the semiconductor layer comprises an n-type semiconductor material.

5. The method of claim 1, wherein the first layer further comprises one or more of nickel (Ni) or platinum (Pt).

6. The method of claim 1, wherein the dopant layer comprises one or more alloying materials to form an alloy with the tin.

7. The method of claim 6, wherein the one or more alloying materials comprises lead (Pb), bismuth (Bi), antimony (Sb), copper (Cu), or indium (In).

8. The method of claim 1, wherein the conductive layer includes a conductive metallic material.

9. The method of claim 8, wherein the conductive metallic material comprises one or more of copper (Cu), tin (Sn), or gold (Au).

10. The method of claim 1,
wherein the annealing of the contact stack is performed at a temperature less than or equal to 200° C.

11. The method of claim 1, wherein one or more of the depositing of the first layer, the depositing of the dopant layer, or the depositing of the conductive layer includes performing a deposition by an electrochemical process.

12. The method of claim 11, wherein the electrochemical process is one or more of a galvanic displacement process, an electroless deposition process, or an electroplating process.

* * * * *